United States Patent
Bhattad et al.

(10) Patent No.: US 9,887,535 B2
(45) Date of Patent: Feb. 6, 2018

(54) SHORT CIRCUIT PROTECTION FOR A POWER SWITCH

(71) Applicant: Dialog Semiconductor (UK) Limited, Reading (GB)

(72) Inventors: Ambreesh Bhattad, Swindon (GB); Frank Kronmueller, Neudenau (DE); Christian Meindl, Munich (DE); Anthony Clowes, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 73 days.

(21) Appl. No.: 14/840,504

(22) Filed: Aug. 31, 2015

(65) Prior Publication Data
US 2016/0233663 A1  Aug. 11, 2016

(30) Foreign Application Priority Data
Feb. 5, 2015 (DE) .................. 10 2015 202 087

(51) Int. Cl.
| | |
|---|---|
| *H02H 3/00* | (2006.01) |
| *H02H 3/20* | (2006.01) |
| *H03K 17/082* | (2006.01) |
| *H02H 9/04* | (2006.01) |
| *H02H 3/087* | (2006.01) |
| *H02H 3/08* | (2006.01) |

(52) U.S. Cl.
CPC ........... *H02H 3/202* (2013.01); *H03K 17/082* (2013.01); *H02H 3/08* (2013.01); *H02H 3/087* (2013.01); *H02H 3/20* (2013.01); *H02H 9/041* (2013.01)

(58) Field of Classification Search
USPC .................. 361/86–87, 93.7–93.9
See application file for complete search history.

(56) References Cited

U.S. PATENT DOCUMENTS

| | | | |
|---|---|---|---|
| 5,537,064 A | 7/1996 | Pease et al. | |
| 5,612,582 A * | 3/1997 | Shichi .............. | H03K 17/04206 307/125 |
| 5,724,218 A * | 3/1998 | Tihanyi .............. | H03K 17/0822 361/54 |
| 6,781,502 B1 | 8/2004 | Robb | |
| 7,158,359 B2 * | 1/2007 | Bertele .............. | H03K 17/0822 361/93.7 |

(Continued)

OTHER PUBLICATIONS

German Office Action and English Translation 10 2015 202 087.8, dated Oct. 7, 2015, Dialog Semiconductor (UK) Ltd.

*Primary Examiner* — Danny Nguyen
(74) *Attorney, Agent, or Firm* — Saile Ackerman LLC; Stephen B. Ackerman (57) ABSTRACT

A power providing circuit which is configured to provide a current at an output voltage to a load at an output of the power providing circuit is described. The power providing circuit comprises a power transistor which is configured to draw the current from a supply voltage, wherein a resistance of the power transistor is controlled using a control voltage which is applied to a control port of the power transistor. Furthermore, the power providing circuit comprises short circuit protection circuitry which is configured to couple the control port of the power transistor with a first port of the power transistor to put the power transistor in an off-state, subject to a drop of the output voltage.

24 Claims, 5 Drawing Sheets

(56) References Cited

U.S. PATENT DOCUMENTS

| | | | |
|---|---|---|---|
| 7,408,755 B1* | 8/2008 | Ye | H02H 3/025 361/93.1 |
| 2002/0021539 A1* | 2/2002 | Odaohhara | H03K 17/063 361/103 |
| 2006/0126253 A1* | 6/2006 | Urakabe | H02M 1/38 361/118 |
| 2007/0053115 A1* | 3/2007 | Tain | G05F 1/575 361/18 |
| 2007/0127180 A1* | 6/2007 | Lin | H03K 17/0822 361/93.7 |
| 2013/0154601 A1* | 6/2013 | Snowdon | G05F 1/571 323/311 |
| 2014/0139143 A1* | 5/2014 | Navabi-Shirazi | H05B 33/0887 315/310 |

* cited by examiner

501
Drawing current for a load from a supply voltage via a power transistor of the power providing circuit 502
Subject to a drop of the output voltage, coupling the gate of the power transistor with a source of the power transistor, to put the power transistor in an off-state. The coupling may be achieved directly using a short circuit control transistor, thereby bypassing other circuitry (e.g. current limit circuitry) of the power providing circuit

FIG. 5

SHORT CIRCUIT PROTECTION FOR A POWER SWITCH

TECHNICAL FIELD

The present document relates to the protection of a power switch, e.g. of the pass device of a voltage regulator, subject to a short circuit at an output port of the power switch.

BACKGROUND

An electronic circuit which provides electrical power to a load, e.g. a voltage regulator such as a low-dropout (LDO) regulator, may comprise a bypass switch in order to provide a direct link to the supply voltage VDD of the electronic circuit. Such a direct link may be beneficial for increasing the reaction speed of the electronic circuit subject to a load transient. The bypass switch may be in a situation where, due to external conditions or due to nonlinear conditions such as a bypass mode, a regulation device of the electronic circuit (e.g. an intermediate amplification stage) is fully opened in order to try to regulate the output voltage of the electronic circuit. As such, the bypass switch may be in a state of maximum current capability also known as a state of lowest resistance, regardless of the actual loading situation of the electronic circuit.

If an external event causes a "short circuit", which is a low-ohmic low inductive connection to another node, while the bypass switch is in a state of lowest resistance, a situation may occur where a significant current is drawn directly from the supply voltage VDD of the electronic circuit. It is desirable to limit or to interrupt such a short circuit current through the bypass switch, as the bypass switch and/or a power supply which provides the supply voltage may be damaged by substantial short circuit currents.

SUMMARY

The present document addresses the technical problem of providing efficient and reliable means for reducing the current through a power switch or power transistor subject to a short circuit situation. According to an aspect, a power providing circuit which is configured to provide a current at an output voltage to a load at an output of the power providing circuit is described. The power providing circuit may be or may comprise bypass circuitry, e.g. bypass circuitry for a voltage regulator. Alternatively or in addition, the power providing circuit may comprise or may be a voltage regulator (e.g. a low dropout regulator).

The power providing circuit comprises a power transistor (which may also be referred to as a power switch, a bypass transistor or a bypass switch) which is configured to draw the current for the load from a supply voltage. The power transistor may comprise a bipolar junction transistor (BJT), an insulated-gate bipolar transistor (IGBT) and/or a metal oxide semiconductor (MOS) transistor. In general terms, the power transistor may comprise any kind of electrical controllable switch. A resistance (e.g. a drain-source resistance in case of a MOS transistor) of the power transistor is controlled using a control voltage (e.g. a gate voltage in case of a MOS transistor) which is applied to a control port (e.g. a gate in case of a MOS transistor) of the power transistor. By varying the resistance, the current through the power transistor may be controlled, i.e. the current through the power transistor which is drawn from the supply voltage may be controlled via the control voltage.

The power transistor may comprise a p-type metal oxide semiconductor (PMOS) transistor. The source of the power transistor may be (directly) coupled to the supply voltage and the drain of the power transistor may be (directly) coupled to the output of the power providing circuit. In more general terms, the source may be referred to as a first port and the drain may be referred to as a second port. Hence, the first port of the power transistor may be (directly) coupled to the supply voltage and the second port of the power transistor may be (directly) coupled to the output of the power providing circuit. As such, the current through the power transistor may be directly drawn from the supply voltage and may be directly provided to the load.

The power providing circuit further comprises short circuit protection circuitry which is configured to couple the control port of the power transistor with the first port of the power transistor to put the power transistor in an off-state, subject to a drop of the output voltage. The short circuit protection circuitry comprises a short circuit control transistor which comprises a second port (e.g. a drain) and a first port (e.g. a source) that are configured to couple the control port (e.g. the gate) and the first port (e.g. the source) of the power transistor with one another. In particular, the short circuit control transistor may be configured to provide a direct connection between the control port and the first port of the power transistor, via a conduction channel (e.g. via the drain-source channel) of the short circuit control transistor (without any further intermediate components). A state and/or the resistance (notably the drain-source resistance) of the short circuit control transistor may be controlled via the control port (e.g. the gate) of the short circuit control transistor, and a voltage level at the control port (e.g. the gate) of the short circuit control transistor may (e.g. only) depend on the output voltage. In particular, the voltage level at the control port (e.g. the gate) of the short circuit control transistor may be independent of a current limit of current limit control circuitry of the power providing circuit and/or of a reference voltage which may be used to set a level of the output voltage of the power providing circuit.

In a similar manner to the power transistor, the short circuit control transistor may comprise or may be a p-type metal oxide semiconductor transistor. The drain of the short circuit control transistor may be (directly) coupled to the gate of the power transistor and the source of the short circuit control transistor may be (directly) coupled to the source of the power transistor. In more general terms, the second port of the short circuit control transistor may be (directly) coupled to the control port of the power transistor and the first port of the short circuit control transistor may be (directly) coupled to the first port of the power transistor.

By making use of short circuit protection circuitry which is configured to provide a short circuit between the control port and the first port of the power transistor directly in response to a drop of the output voltage, the current through the power transistor may be interrupted rapidly in response to a "short circuit" condition at the output of the power providing circuit. As such, efficient, reliable and fast means for reducing the current through a power transistor subject to a short circuit situation are provided.

The short circuit protection circuitry (in particular, the short circuit control transistor) may be configured to couple the control port of the power transistor with the first port of the power transistor only if a "short circuit" condition is met. Otherwise, the short circuit protection circuitry (in particular, the short circuit control transistor) may not couple the control port to the first port of the power transistor. As such, the short circuit protection circuitry may be inactive during normal operation of the power providing circuit, and may only be used in case a "short circuit" condition is met. By doing this, the short circuit protection circuitry may be added to the power providing circuit without impacting other components of the power providing circuit during normal operation of the power providing circuit (e.g. a regulation loop of current limit circuitry and/or a regulation loop of a voltage regulator).

The "short circuit" condition may be met if a slope of the drop of the output voltage exceeds a pre-determined slope-threshold and/or if a level of the drop of the output voltage exceeds a pre-determined level-threshold. The short circuit protection circuitry (in particular, the short circuit control transistor) may be designed in accordance to the slope-threshold and/or the level-threshold. In particular, a threshold voltage of the short circuit control transistor may be selected in dependence of the slope-threshold and/or the level-threshold. Alternatively or in addition, a driver circuit of the short circuit control transistor (which is configured to derive the voltage level at the gate of the short circuit control transistor based on the output voltage) may be dependent on the slope-threshold and/or the level-threshold. By doing this, it may be ensured that the short circuit control transistor is only activated if the "short circuit" condition is met, and that the short circuit control transistor remains open if the "short circuit" condition is not met (e.g. because the slope and/or the level of the drop of the output voltage are not sufficiently high).

The short circuit protection circuitry (in particular the driver circuit for the short circuit control transistor) may comprise high pass filtering means which are configured to derive the voltage level at the control port (e.g. the gate) of the short circuit control transistor by high pass filtering the output voltage. The high pass filtering means may be designed in dependence of the slope-threshold. In particular, the high pass filtering means may be configured to modify the voltage level at the control port (e.g. the gate) of the short circuit control transistor such that the short circuit control transistor goes from an off-state to an on-state only if the "short circuit" condition is met. In other words, the high pass filtering means may be configured to provide a voltage level at the control port of the short circuit control transistor such that the threshold voltage of the short circuit control transistor is exceeded, if the short circuit condition is met. Furthermore, the high pass filtering means may be configured to, otherwise, provide a voltage level at the control port of the short circuit control transistor such that the threshold voltage of the short circuit control transistor is not exceeded (in order to ensure that the short circuit control transistor remains open, whenever the "short circuit" condition is not met).

The short circuit protection circuitry (in particular the driver circuit of the short circuit control transistor, and even more particularly the high pass filtering means) may comprise a filtering resistor which is (directly) coupled between the control port and the first port of the short circuit control transistor. Furthermore, the short circuit protection circuitry (in particular the driver circuit of the short circuit control transistor, and even more particularly the high pass filtering means) may comprise a filtering capacitor which is (directly) coupled to the control port of the short circuit control transistor at one side and to the output of the power providing circuit at another side of the filtering capacitor. The filtering resistor and the filtering capacitor may form an RC circuit with a time constant. The time constant may be dependent on the slope-threshold and/or the level-threshold. Such an RC circuit provides efficient means for driving the short circuit control transistor such that the short circuit control transistor is only activated if the "short circuit" condition is met.

The short circuit protection circuitry (in particular the driver circuit of the short circuit control transistor, and even more particularly the high pass filtering means) may comprise an amplifier and/or attenuator which is configured to amplify and/or attenuate a voltage which is derived from the output voltage, e.g. a voltage at the output of the high pass filtering means, prior to applying the attenuated/amplified voltage to the gate of the short circuit control transistor. In particular, the voltage at a midpoint between the filtering resistor and the filtering capacitor may be amplified/attenuated by the amplifier/attenuator. The output of the amplifier/attenuator may be (directly) coupled to the control port of the short circuit control transistor. The gain of the amplifier/attenuator may depend on the threshold voltage of the short circuit control transistor and/or on the level-threshold. As such, the amplifier/attenuator may be used to tune the short circuit protection circuitry to be activated only if the "short circuit" condition is met.

The power providing circuit may further comprise current limit circuitry which is configured to limit the current through the power transistor in accordance to a pre-determined current limit. The current limit circuitry may comprise sensing means which are configured to provide an indication of the current through the power transistor. Furthermore, the current limit circuitry may comprise comparing means which are configured to provide a feedback voltage by comparing the indication of the load current with the pre-determined current limit. In addition, the current limit circuitry may comprise feedback means which are configured to set the control voltage (e.g. the gate voltage) at the control port of the power transistor in dependence of the feedback voltage.

As such, the current limit circuitry may be used to limit the current through the power transistor and to thereby protect the power transistor and the supply voltage (during normal operation of the power providing circuit). However, the short circuit protection circuitry may be configured to couple the control port with the first port of the power transistor within a first reaction time interval, subject to the drop of the output voltage, and the current limit circuitry may be configured to limit the current through the power transistor in accordance to the pre-determined current limit within a second reaction time interval, subject to the drop of the output voltage. The first reaction time interval may be smaller than the second reaction time interval. The relatively fast reaction time interval of the short circuit protection circuitry may be achieved by the direct coupling of the control port and the first port of the power transistor using the short circuit control transistor. On the other hand, the current limit circuitry typically comprises a feedback loop which allows for the setting and/or regulation of the current limit. Such a feedback loop may be relatively slow compared to the direct coupling of the control port and the first port of the power transistor which is achieved by the short circuit control transistor.

As such, the power providing circuit may comprise a combination of relatively slow and precise current limit circuitry (for setting a current limit during "normal" operation of the power providing circuit, i.e. in cases when the "short circuit" condition is not met) and short circuit projection circuitry (for interrupting the current through the power transistor in short circuit situations, i.e. in cases when the "short circuit" condition is met).

The sensing means of the current limit circuitry may comprise a sensing transistor having a control port (e.g. a gate) that is (directly) coupled to the control port of the power transistor, and having a first port (e.g. a source) that is (directly) coupled to the first port of the power transistor, and having a second port (e.g. a drain) that is coupled to the second port (e.g. the drain) of the power transistor via a current mirror. Furthermore, the feedback means may comprise a feedback transistor having a control port (e.g. a gate) that the feedback voltage is applied to, wherein the control voltage is dependent on a resistance (e.g. a drain-source resistance) of the feedback transistor. In addition, the comparing means may comprise a current mirror which is configured to map a current through the sensing transistor to the control port (e.g. the gate) of the feedback transistor, and a current source which is configured to provide a current to the control port (e.g. the gate) of the feedback transistor which is in accordance to the current limit.

As indicated above, the power providing circuit may comprise or may be a voltage regulator which is configured to regulate the output voltage in accordance to a reference voltage. The voltage regulator may comprise voltage sensing means which are configured to provide an indication of the output voltage, and a differential amplification stage which is configured to provide an input voltage, based on the reference voltage and based on the indication of the output voltage at the output node. The control voltage which is applied to the control port of the power transistor may depend on the input voltage (e.g. via an intermediate or second amplification stage of the voltage regulator).

As such, the control of the power transistor may be embedded into the regulation of a voltage regulator. In the context of such a regulation, it may occur that the power transistor is set to have a relatively low resistance, notably drain-source resistance (e.g. subject to a load transient of the load at the output of the power providing circuit). The short circuit projection circuitry described in the present document is particularly beneficial to protect the power transistor and/or the supply voltage if a short circuit situation occurs when the power providing circuit is operated in such a situation.

The voltage regulator may comprise a pass device which is configured to provide a current to the load. The pass device may be arranged in parallel to the power transistor between the supply voltage and the output of the power providing circuit. As such, the power transistor may assist the pass device in providing additional current to the output of the power providing circuit in case of load transients.

According to another aspect, a method for protecting a power transistor in case of a short circuit situation is described. The method comprises drawing current for a load from a supply voltage via a power transistor, wherein a resistance (e.g. a drain-source resistance) of the power transistor is controlled using a control voltage (e.g. a gate voltage) which is applied to a control port (e.g. a gate) of the power transistor and wherein the current is provided to the load at an output voltage. Furthermore, the method comprises, subject to a drop of the output voltage, coupling the control port of the power transistor with a first port (e.g. a source) of the power transistor, to put the power transistor in an off-state.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
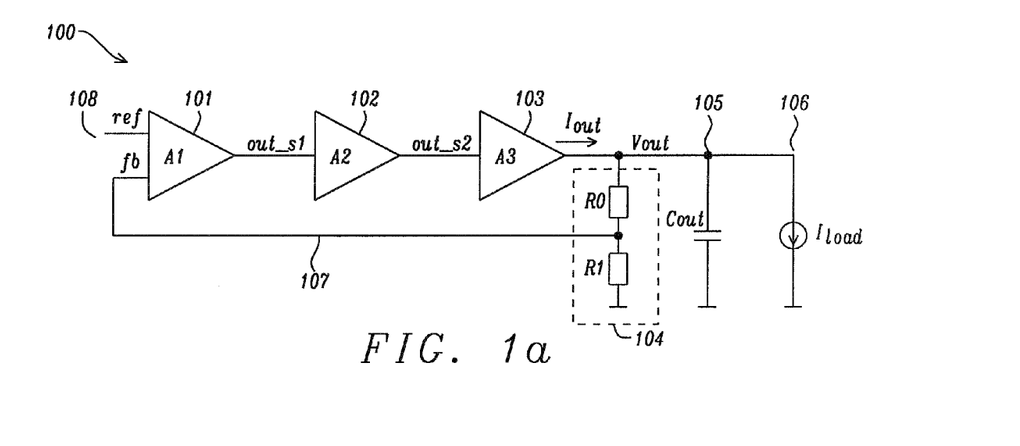
FIG. 1a illustrates an example block diagram of an LDO regulator.

As outlined above, electronic power providing circuits such as voltage regulators may comprise one or more bypass switches which are configured to couple an output of the power providing circuit directly with a supply voltage of the power providing circuit. This may be beneficial for increasing the reaction speed of the power providing circuit subject to load transients at the output of the power providing circuit. An example of a power providing circuit is an LDO regulator. A typical LDO regulator 100 is illustrated in FIG. 1a. The LDO regulator 100 comprises an output amplification stage 103, e.g. a field-effect transistor (FET), at the output and a differential amplification stage or differential amplifier 101 (also referred to as error amplifier) at the input. A first input (fb) 107 of the differential amplifier 101 receives a fraction of the output voltage $V_{out}$ determined by the voltage divider 104 comprising resistors R0 and R1. The second input (ref) to the differential amplifier 101 is a stable voltage reference $V_{ref}$ 108 (also referred to as the bandgap reference). If the output voltage $V_{out}$ changes relative to the reference voltage $V_{ref}$, the drive voltage to the output amplification stage, e.g. the power FET, changes by a feedback mechanism called main feedback loop to maintain a constant output voltage $V_{out}$.

The LDO regulator 100 of FIG. 1a further comprises an additional intermediate amplification stage 102 configured to amplify the output voltage of the differential amplification stage 101. As such, an intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as output capacitor or stabilization capacitor or bybass capacitor) 105 parallel to the load 106. The output capacitor 105 is used to stabilize the output voltage $V_{out}$ subject to a change of the load 106, in particular subject to a change of the load current $I_{load}$. It should be noted that typically the output current $I_{out}$ at the output of the output amplification stage 103 corresponds to the load current $I_{load}$ through the load 106 of the regulator 100 (apart from typically minor currents through the voltage divider 104 and the output capacitance 105). Consequently, the terms output current $I_{out}$ and load current $I_{load}$ are used synonymously, if not specified otherwise.

Typically, it is desirable to provide a stable output voltage $V_{out}$, even subject to (positive or negative) transients of the load 106. By way of example, the regulator 100 may be used to provide a stable output voltage $V_{out}$ to the processor of an electronic device (such as a smartphone). The load current $I_{load}$ may vary significantly between a sleep state and an active state of the processor, thereby varying the load 106 of the regulator 100. In order to ensure a reliable operation of the processor, the output voltage $V_{out}$ should remain stable, even in response to such load transients. In particular, overvoltage and/or undervoltage situations of the output voltage $V_{out}$ should be avoided.

At the same time, the LDO regulator 100 should be able to react rapidly to load transients, i.e. the LDO regulator 100 should be able to rapidly provide the requested load current $I_{load}$, subject to a load transient. This means that the LDO regulator 100 should exhibit a high bandwidth.

Figure 1B:
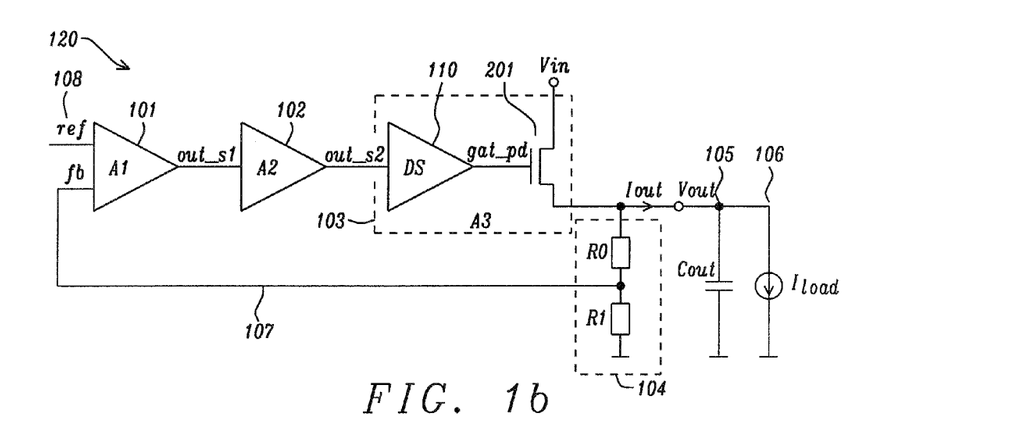
FIG. 1b illustrates the example block diagram of an LDO regulator in more detail.

FIG. 1b illustrates the block diagram of a LDO regulator 120, wherein the output amplification stage A3 (reference numeral 103) is depicted in more detail. In particular, the pass transistor or pass device 201 and the driver stage 110 of the output amplification stage 103 are shown. Typical parameters of an LDO regulator are a supply voltage of 3V, an output voltage of 2V, and an output current or load current ranging from 1 mA to 100 or 200 mA. Other configurations are possible. The present invention is described in the context of a linear regulator. It should be noted, however, that the present invention is applicable to power provisioning circuits in general.

Figure 2:
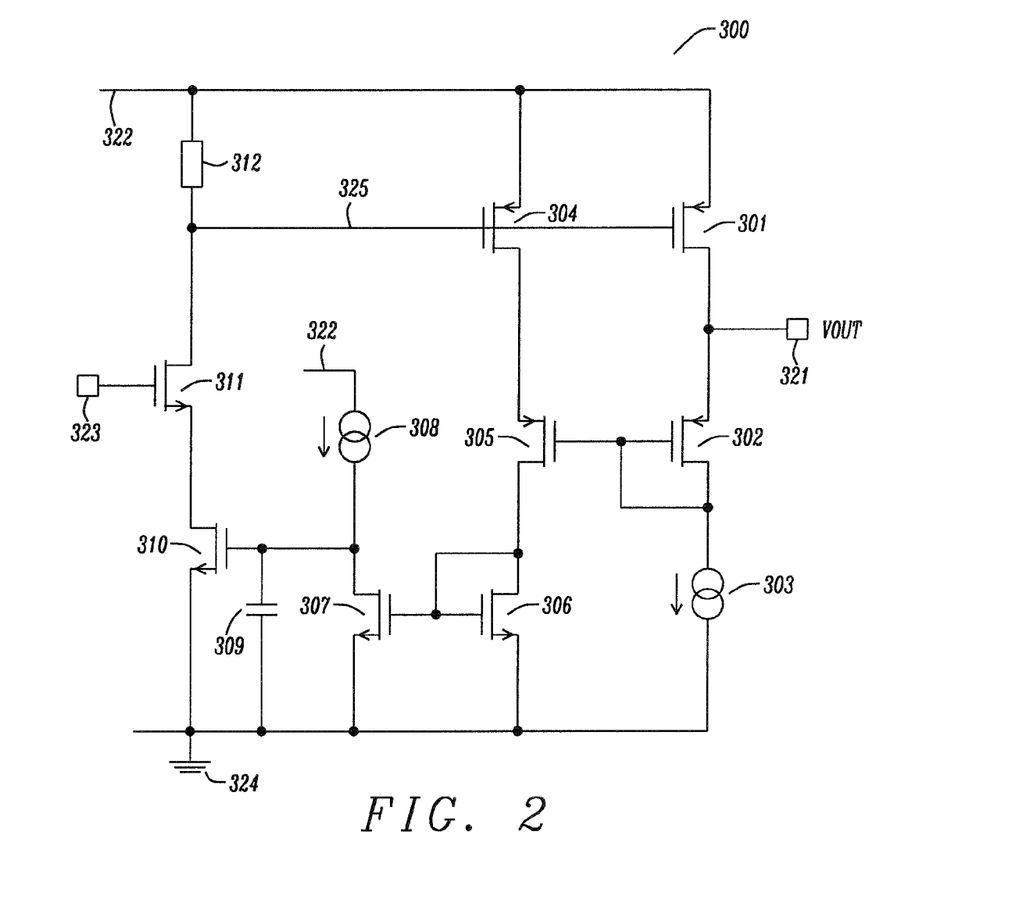
FIG. 2 shows a circuit diagram of an example bypass switch with a current limit circuit.

As indicated above, a bypass circuit may be provided in conjunction with a voltage regulator 100, 120 in order to increase the reaction speed of the voltage regulator 100, 120 subject to a load transient. An example bypass circuit 300 is illustrated in FIG. 2. The bypass circuit may be considered to be an example of a generic power providing circuit. The bypass circuit 300 comprises a power transistor 301 (also referred to herein as a bypass transistor) which is configured to couple the output voltage $V_{out}$ 321 with the supply voltage VDD 322 (also referred to as Vin in FIG. 1b). As such, the power transistor 301 may be arranged in parallel to the pass device 201 of the voltage regulator 100, 120. In another example arrangement, the power transistor 301 corresponds to (e.g. is equal to) the pass device 201 of the voltage regulator 100, 120. In the illustrated example in FIG. 2, the power transistor 301 is a PMOS transistor.

The power transistor 301 may be controlled by the gate voltage 325 which is applied to the gate of the power transistor 301. The gate voltage 325 is set using the input control transistor 311, a state of the input control transistor 311 being dependent on the enabling voltage 323 which is applied to the gate of the input control transistor 311. The enabling voltage 323 may correspond to (e.g. be equal to) the output voltage of the second amplification stage 102 (i.e. out_s2) of the voltage regulator 100, 120 shown in FIGS. 1a, 1b. In the illustrated example, the input control transistor 311 is a NMOS transistor.

If the input control transistor 311 is enabled using the enabling voltage 323, the gate voltage 325 is pulled down, thereby enabling the power transistor 301. A level of the gate voltage 325 may be set by a resistance value of the gate resistor 312. As such, the power transistor 301 may be opened in dependence of the level of the enabling voltage 323, thereby providing a current to the output node of the bypass circuit 300 and thereby stabilizing the output voltage 321.

The bypass circuit 300 of FIG. 2 further comprises current limit circuitry which is configured to limit the current through the power transistor 301. The current limit circuitry comprises a sensing transistor 304 which is configured to sense a state of the power transistor 301. The sensing transistor 304 may correspond to the power transistor 301, however, at reduced dimensions. In particular, the sensing transistor 304 may be configured to provide an indication of the current through the power switch. In other words, the current through the sensing transistor 304 may correspond to (e.g. may be equal to) the current through the power transistor 301, by a pre-determined scaling factor, wherein the scaling factor depends on the dimensions of the sensing transistor 304 in relation of the dimensions of the power transistor 301.

The current limit circuitry may further comprise a first current mirror comprising the transistors 302, 305. The current mirror is coupled to the drain of the power transistor 301 (which corresponds to the output node of the bypass circuit 300) and to the drain of the sensing transistor 304. By doing this, the output voltage 321 may be "copied" from the drain of the power transistor 301 to the drain of the sensing transistor 304, thereby setting the sensing transistor 304 to the same operating point as the power transistor 301. The current through the sensing transistor 304 (which is also referred to as the sensing current) provides an indication of the current through the power transistor 301 (e.g. is proportional to the current through the power transistor 301).

The sensing current may be compared with a pre-determined current limit which is set by a first current source 308. For this purpose, a second current mirror which comprises the transistors 306, 307 may be used as illustrated in FIG. 2. The second current mirror "copies" the sensing current from the transistor 306 to the transistor 307 (possibly in an amplified or attenuated manner). A drain of the transistor 307 is coupled to the first current source 308, such that the sensing current is compared to the current limit. The drain of the transistor 307 is coupled to the gate of a feedback transistor 310, which is implemented as a NMOS transistor in the illustrated example. If the current limit is higher than the (amplified/attenuated) sensing current, then the gate of the feedback transistor 310 is pulled up, thereby opening the feedback transistor 310 and thereby allowing the power transistor 301 to be controlled by the enabling voltage 323. On the other hand, if the current limit is smaller than the (amplified/attenuated) sensing current, then the gate of the feedback transistor 310 is pulled down, thereby closing the feedback transistor 310 and thereby interrupting the current flowing through the enabling transistor 311 (regardless the level of the enabling voltage 323). As a result of this, the gate voltage 325 is pulled up, thereby closing the power transistor 301, and thereby reducing the current through the power transistor 301.

As such, the current limit circuitry provides a regulation loop for ensuring that the current through the power transistor 301 does not exceed a level which is set using the current limit that is provided by the first current source 308.

The current limit circuitry may further comprise a gate capacitor 309 which couples the gate of the feedback transistor 310 to ground 324. Such a gate capacitor 309 may be used to ensure a reliable deactivation of the current limit, in case of a situation where the current through the power transistor 301 does not exceed the current limit. Furthermore, a second current source 303 may be used to compensate the drain-source voltage across the transistor 306, in order to ensure a precise alignment of the operating points of the power transistor 301 and of the sensing transistor 304.

Due to the design of the current limit circuitry and in order to keep the current consumption relatively low, the activation time of the current limit circuitry may be relatively long prior to limiting the current through the power transistor 301. This may lead to a situation, notably in case of a short circuit, where the current through the power transistor 301 becomes very high, thereby overloading the supply voltage 322. Due to the low-ohmic nature of a short circuit, the spread and speed of the peak current through the power transistor 301, subject to a short circuit, may be highly variable.

Figure 3A:
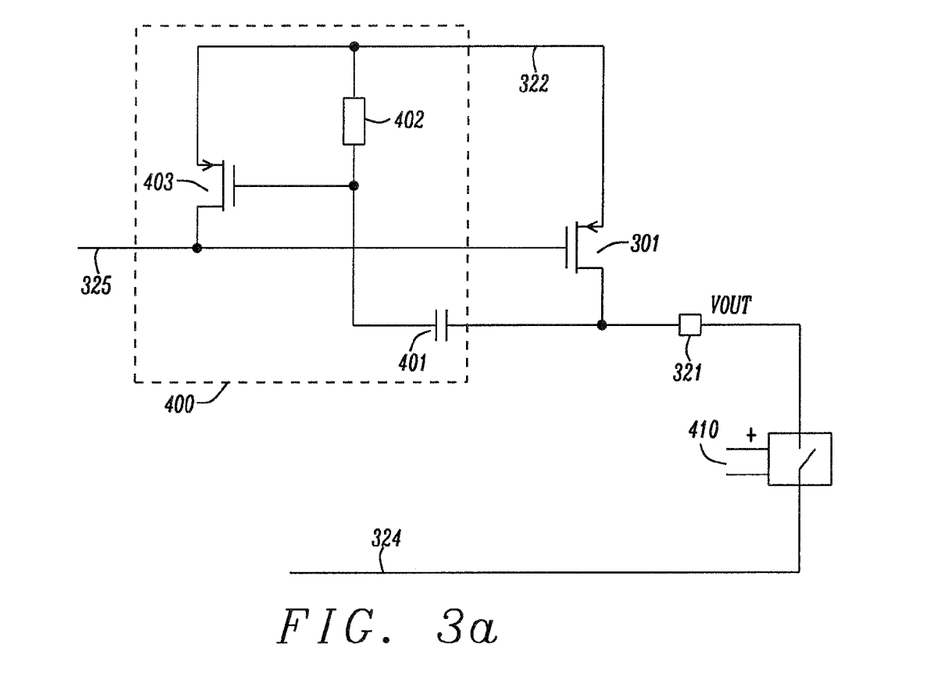
FIGS. 3a, 3b and 3c show circuit diagrams of example short circuit protection circuitry.

FIG. 3a illustrates example short circuit protection circuitry 400 which may be used to protect the supply voltage 322 and the power transistor 301 from a short circuit situation. The short circuit protection circuitry 400 is preferably used in conjunction with current limit circuitry (as the one illustrated in FIG. 2). The short circuit protection circuitry comprises a short circuit control transistor 403 which is configured to couple the gate of the power transistor 301 with the supply voltage 322 in order to close the power transistor 301. In the illustrated example, the short circuit control transistor 403 is implemented as a PMOS transistor.

The short circuit control transistor 403 is controlled based on the output voltage 321. As a result of a short circuit (simulated using the switch 410), the output voltage 321 typically exhibits a substantial drop which leads to a drop of the voltage at the gate of the short circuit control transistor 403, thereby opening the short circuit control transistor 403 and thereby coupling the gate of the power transistor 301 to the supply voltage 322. This causes the power transistor 301 to close, thereby reducing the current which is drawn from the supply voltage 322.

The short circuit protection circuitry may further comprise means for filtering the output voltage 321 (also referred to herein as high pass filtering means). In particular, the means for filtering may be configured as a high pass filter, such that only relatively fast variations (such as a drop which is caused by a short circuit) are passed to the gate of the short circuit control transistor 403, and such that relatively slow variations of the output voltage 321 are not passed to the gate of the short circuit control transistor 403. As a result of this, the gate of the short circuit control transistor 403 may float (in the absence of a substantial drop of the output voltage 321) such that the short circuit control transistor 403 remains open, thereby not coupling the gate of the power transistor 301 from the drain of the power transistor 301.

The means for filtering the output voltage 321 may comprise an RC circuit 401, 402 as illustrated in FIG. 3a, wherein the RC circuit 401, 402 comprises a filtering resistor 402 and a filtering capacitor 401. The filtering resistor 402 is arranged between the gate and the source of the short circuit control transistor 403 and the filtering capacitor 401 is used to couple the gate of the short circuit control transistor 403 with the output voltage 321. As a result of this, a rapid transient of the output voltage 321 is directly coupled to the gate of the short circuit control transistor 403. In particular, a drop of the output voltage 321 directly affects the voltage at the gate of the short circuit control transistor 403, thereby closing the short circuit control transistor 403. On the other hand, relatively slow variations of the output voltage 321 are filtered by the filtering capacitor 401 and the filtering resistor 402, such that the state of the short circuit control transistor 403 remains unaffected (i.e. open) by such slow variations.

The RC circuit 401, 402 has the additional affect that the voltage at the gate of the short circuit control transistor 403 re-increases with increasing time interval since the drop of the output voltage 321. In particular, the gate of the short circuit control transistor 403 goes back into a floating state, thereby re-opening the short circuit control transistor 403, and thereby re-opening the power transistor 301. The length of the time interval between the closing of the short circuit control transistor 403 and the re-opening of the short circuit control transistor 403 depends on the time constant $\tau=RC$ of the RC circuit 401, 402, wherein R is the resistance of the filtering resistor 402 and wherein C is the capacitance of the filtering capacitor 401. The time constant $\tau$ may be selected to be sufficiently large to allow the current limit circuitry to react to the short circuit situation. In other words, the short circuit protection circuitry 400 may be configured to automatically disable itself after a pre-determined time interval following a short circuit, thereby bridging a reaction time of current limit circuitry of the power provisioning circuit 300.

Hence, rather than waiting for the current limit regulation of the current limit circuitry to become active, this process is short-cut by switching the power transistor 301 from a conduction-mode into an off-mode. As a result of this, the current which is drawn from the supply voltage 322 is stopped.

In order to allow for a stable current regulation of the current limit circuitry the frequency response of the current limit circuitry typically needs to be limited, thereby creating a delay in the reaction of the current limit circuitry to a short circuit. Furthermore, due to the low power nature of the current limit circuitry the limiting reaction of the current limit circuitry may take a certain time interval until the power transistor 301 is turned off. During this time interval a substantial current is flowing through the power transistor 301, wherein the current is only limited by a very small on-resistance (i.e. drain-source resistance) of the power transistor 301.

The short circuit protection circuitry 400 is configured to observe the output voltage 321. Once a fast drop of the output voltage 321 is detected (with a relatively large slope having a magnitude that is larger than a slope-threshold), the short circuit control transistor 403 is activated to discharge the gate of the power transistor 301 quickly which stops any current through the power transistor 301.

Subsequently, the current limit circuitry re-activates the power transistor 301 coming from an off-state of the power transistor 301 (and not coming from an overdriven on-state of the power transistor 301). This ensures a stable activation of the regulation mode of the current limit circuitry.

As already indicated above, the current limit circuitry of FIG. 2 requires a certain time interval prior to limiting the current through the power transistor 301. As a result of this, a relatively large current may be drawn from the supply voltage 322 prior to an activation of the current limit. This leads to a situation where a trade-off needs to be made between a low switch resistance of the power transistor 301, a limited short circuit current and a low internal current consumption of the current limit circuitry.

In order to address this technical problem, an RC element 401, 402 which is connected to the output voltage 321 may be used to detect a fast drop of the output voltage 312 which is the indication of a "short circuit" condition. Such a "short circuit" condition may be distinguished from a "load transient" condition by a level of the drop of the output voltage 321. Typically the level of the voltage drop in case of a "short circuit" condition is higher than the level of the voltage drop in case of a "load transient" condition.

Figure 3B:
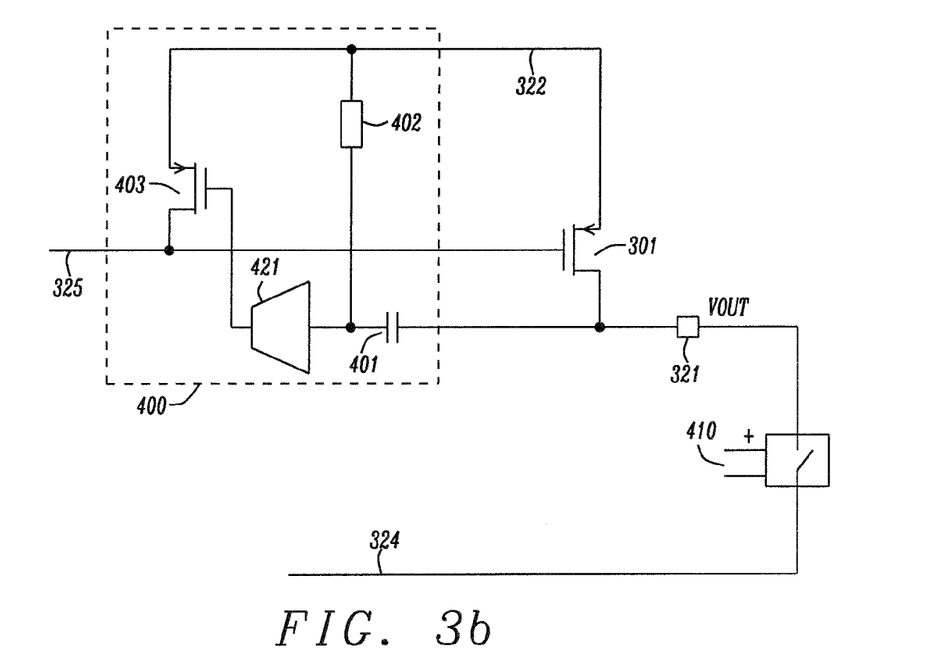

The level of the voltage drop of a "short circuit" condition may correspond to the threshold voltage of the short circuit control transistor 403. As such, the threshold voltage of the short circuit control transistor 403 may be set such that the short circuit control transistor 403 is only closed, if the level of the voltage drop is sufficiently high to indicate a "short circuit" condition (in contrast to a "load transient" condition). As shown in FIG. 3b an amplifier 421 may be used to adjust the appropriate level of voltage drop to the threshold voltage of the short circuit control transistor 403. Alternatively of in addition, a differential input stage may be used to activate the short circuit control transistor 403 if the voltage drop of the output voltage 321 is lower than the threshold voltage of the short circuit control transistor 403. This, however, may increase the current consumption for ensuring a fast operation of the short circuit protection circuitry 400.

FIG. 3b shows example short circuit protection circuitry 400 which comprises a gate voltage amplifier 421. The gate voltage amplifier 421 may be used to adjust the reaction speed of the short circuit protection circuitry 400 by amplifying the voltage at the midpoint between the filtering capacitor 401 and the filtering resistor 402 and by applying the amplified voltage to the gate of the short circuit control transistor 403. As such, an amplifier 421 may be used to maximally short the gate of the power transistor 301. The stop of current flow from the supply voltage 322 typically increases the slope of the discharge. This forms a positive feedback loop until the output is discharged and the slope zeros.

While the short circuit projection circuitry 400 is activated, notably while the short circuit control transistor 403 couples the gate to the source of the power transistor 301, other circuitry (e.g. current limits) of the power providing circuit 300 may be turned off temporarily, in order to prevent adverse effects of the gate shorting either by function and/or capacitive coupling effects.

The short circuit projection circuitry 400 only makes use of the drop of the output voltage 321 as an indication for a "short circuit" condition. The drop of the output voltage 321 typically requires a certain current flow through the power transistor 301. The level of the current flowing through the power transistor 301 typically depends on the resistance of the power transistor 301. As such, the resistance of the power transistor 301 influences the distinction between a "short circuit" condition and a "load transient" condition.

Typically the peak current through the power transistor 301 increases with the delay in the detection of the "short circuit" condition and in the activation of the short circuit protection circuitry 400.

Figure 3C:
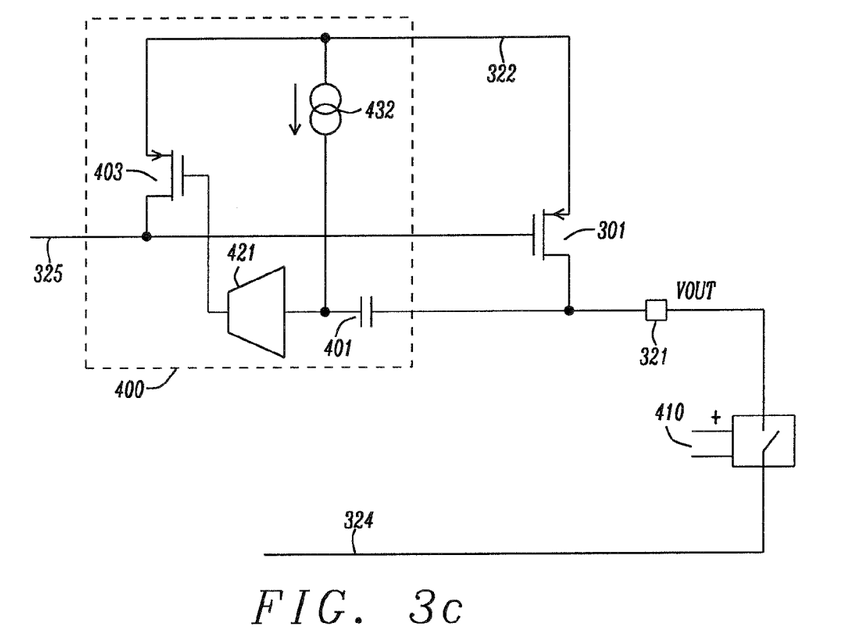

FIG. 3c shows example short circuit protection circuitry 400 which comprises a current source 432 which is referred to herein as the filtering current source 432. In the illustrated example, the filtering current source 432 replaces the filtering resistor 402. The filtering current source 432 may be used for detecting the slope of a drop of the output voltage 321. In particular, the filtering current source 432 may be configured to provide a pre-determined current, wherein the pre-determined current allows to tune the short circuit protection circuitry 400 such that the short circuit control transistor 403 is closed if the slope of the drop of the output voltage 321 is indicative of a "short circuit" condition, and such that the short circuit control transistor 403 is left open if the slope of the drop of the output voltage 321 is indicative of a "load transient" condition. As such, the pre-determined current which is provided by the filtering current source 432 may depend on the slope-threshold.

It can be shown experimentally how the load current at the output of the power providing circuit 300 increases in reaction to a short circuit. As a result of this, the output voltage 321 drops. The drop of the output voltage 321 triggers the short circuit control transistor 403 to switch off the power transistor 301. This is achieved by pulling the gate voltage 325 at the gate of the power transistor 301 high. After a time interval (which depends on the time constant of the RC circuit 401, 402) the short circuit control transistor 403 opens again such that the gate of the power transistor 301 is released again. As a result of this, the relatively slower current regulation starts up and regulates the output current of the power transistor 301 to the target value given by the current limit which is set by the first current source 308 (if such regulation is possible due to external conditions). A return to normal operation is possible as soon as the short circuit condition is removed.

As such, it may be observed that the current increase through the power transistor 301, subject to a short circuit, may be limited using the short circuit protection circuitry 400 which is described in the present document. A change of slope of the output voltage 321 may be observed during the activation of the short circuit protection circuitry 400. Such a change of slope indicates that the current increase from the supply voltage 322 has been stopped within the transition of the slope of the output voltage 321.

Figure 4A:
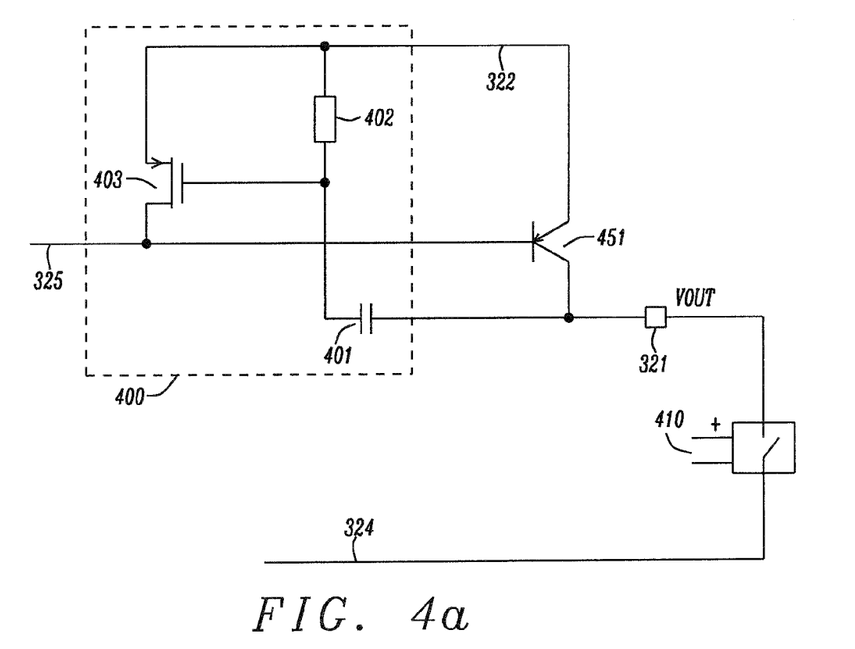
FIGS. 4a and 4b show circuit diagrams of example short circuit protection circuitry for a bipolar transistor.
Figure 4B:
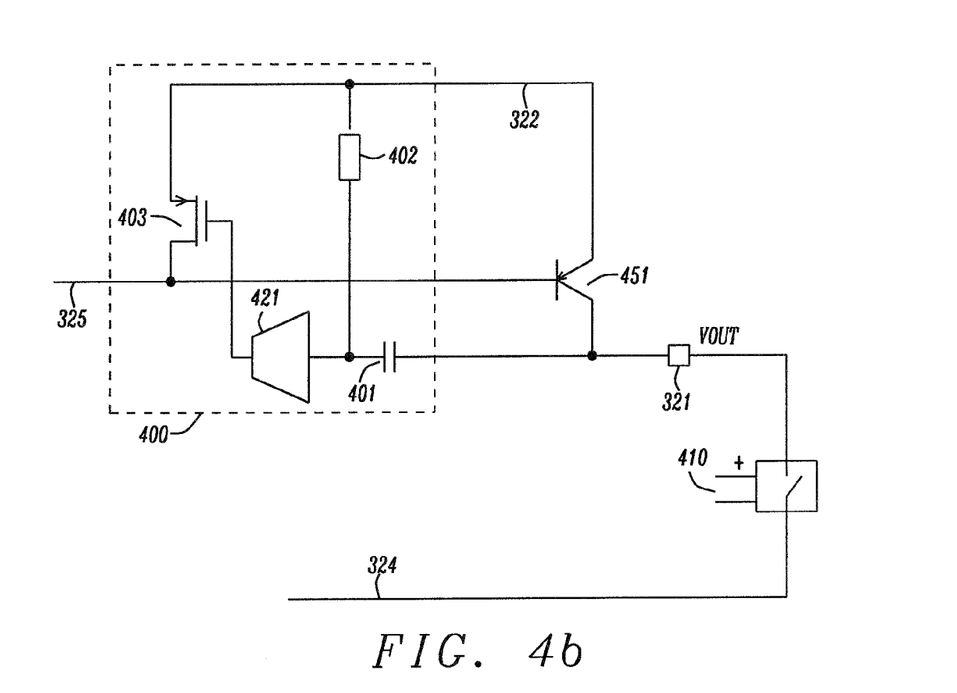

It should be noted that the short circuit protection circuitry 400 may also be applied to a bipolar junction transistor (BJT) and/or an insulated-gate bipolar transistor (IGBT). Furthermore, one or more of the transistors of the short circuit protection circuitry 400 may comprise or may be implemented as bipolar junction transistors (BJT) and/or insulated-gate bipolar transistors (IGBT). FIGS. 4a and 4b show short circuit protection circuitry 400 in conjunction with a bipolar junction transistor 451. The bipolar transistor 451 is coupled to the short circuit protection circuitry 400 in an analogous manner as the power transistor (MOSFET) 301, wherein the gate of the power transistor 301 corresponds to the base of the BJT 451, the source of the power transistor 301 corresponds to the emitter of the BJT 451 and the drain of the power transistor 301 corresponds to the collector of the BJT 451. In the present document, the MOS transistor 301 and the BJT 451 are referred to as power transistors. Furthermore, the gate/base is referred to as the control port, the source/emitter is referred to as a first port and the drain/collector is referred to as a second port. Furthermore, the resistance of a power transistor 301, 451 corresponds to the drain-source resistance of a MOS transistor 301 or to the collector-emitter resistance of a BJT 451.

Figure 5:
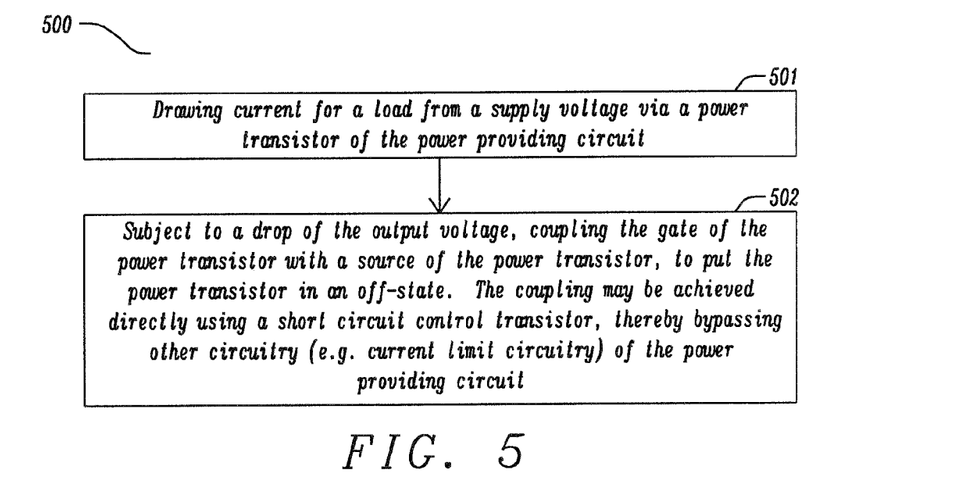
FIG. 5 shows a flow chart of an example method for protecting a power switch subject to a short circuit.

FIG. 5 shows a flow chart of an example method 500 for protecting a power transistor 301 in case of a short circuit situation at an output of a power providing circuit 300. The method 500 comprises drawing 501 current for a load 106 from a supply voltage 322 via a power transistor 301 of the power providing circuit 300. A drain-source resistance of the power transistor 201, 301 is controlled using a gate voltage 325 which is applied to a gate of the power transistor 201, 301. The current is provided to the load 106 at an output voltage 321. In addition, the method 500 comprises, subject to a drop of the output voltage 321, coupling 502 the gate of the power transistor 201, 301 with a source of the power transistor 201, 301, to put the power transistor 201, 301 in an off-state. The coupling 502 may be achieved directly using a short circuit control transistor 403, thereby bypassing other circuitry (e.g. current limit circuitry) of the power providing circuit 300.

As such, short circuit protection circuitry 400 has been described which allows for an efficient and reliable protection of a power providing circuit 300 subject to a "short circuit" condition, notably in combination with regulated current limit circuitry.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A power providing circuit which is configured to provide a current at an output voltage to a load at an output of the power providing circuit, wherein the power providing circuit comprises,
   a power transistor which is configured to draw the current from a supply voltage, wherein a resistance of the power transistor is controlled using a control voltage which is applied to a control port of the power transistor; and
   short circuit protection circuitry which is configured to couple the control port of the power transistor with a first port of the power transistor to put the power transistor in an off-state, subject to a drop of the output voltage; wherein the short circuit protection circuitry comprises a short circuit control transistor which comprises a first port and a second port which are configured to couple the control port and the first port of the power transistor; wherein a state of the short circuit control transistor is controlled via a control port of the short circuit control transistor; and wherein a voltage level at the control port of the short circuit control transistor depends on the output voltage; wherein the short circuit protection circuitry is configured to couple the control port with the first port of the power transistor within a first reaction time interval, subject to the drop of the output voltage; and
   current limit circuitry which is configured to limit the current through the power transistor in accordance to a pre-determined current limit; wherein the current limit circuitry is configured to limit the current through the power transistor in accordance to the pre-determined current limit within a second reaction time interval, subject to the drop of the output voltage; and wherein the first reaction time interval is smaller than the second reaction time interval.

2. The power providing circuit of claim 1, wherein the short circuit protection circuitry is configured to couple the control port of the power transistor with a first port of the power transistor only if
   a slope of the drop of the output voltage exceeds a pre-determined slope-threshold; and/or
   a level of the drop of the output voltage exceeds a pre-determined level-threshold.

3. The power providing circuit of claim 1, wherein the short circuit protection circuitry comprises high pass filtering means which are configured to derive the voltage level at the control port of the short circuit control transistor by high pass filtering the output voltage.

4. The power providing circuit of claim 3, wherein the high pass filtering means are configured to
   provide a voltage level at the control port of the short circuit control transistor such that a threshold voltage of the short circuit control transistor is exceeded, if a short circuit condition is met; wherein the short circuit condition depends on a slope and/or a level of the drop of the output voltage; and
   otherwise, provide a voltage level at the control port of the short circuit control transistor such that the threshold voltage of the short circuit control transistor is not exceeded.

5. The power providing circuit of claim 4, wherein the short circuit condition is met, if
   the slope of the drop of the output voltage exceeds a pre-determined slope-threshold; and/or
   the level of the drop of the output voltage exceeds a pre-determined level-threshold.

6. The power providing circuit of claim 1, wherein the short circuit protection circuitry comprises
   a filtering resistor which is coupled between the control port and the first port of the short circuit control transistor; and
   a filtering capacitor which is coupled to the control port of the short circuit control transistor at one side and to the output of the power providing circuit at another side of the filtering capacitor.

7. The power providing circuit of claim 1, wherein the short circuit protection circuitry comprises a control port amplifier configured to amplify and/or attenuate a voltage which is derived from the output voltage prior to application to the control port of the short circuit control transistor.

8. The power providing circuit of claim 1, wherein the current limit circuitry comprises
   sensing means configured to provide an indication of the current through the power transistor;
   comparing means configured to provide a feedback voltage by comparing the indication of the load current with the pre-determined current limit; and
   feedback means configured to set the control voltage at the control port of the power transistor in dependence of the feedback voltage.

9. The power providing circuit of claim 8, wherein
   the sensing means comprise a sensing transistor having a control port that is coupled to the control port of the power transistor, and having a first port that is coupled to the first port of the power transistor, and having a second port that is coupled to a second port of the power transistor via a current mirror; and/or
   the feedback means comprise a feedback transistor having a control port that the feedback voltage is applied to, wherein the control voltage is dependent on a resistance of the feedback transistor; and/or
   the comparing means comprise a current mirror configured to map a current through the sensing transistor to the control port of the feedback transistor, and a current source configured to provide a current to the control port of the feedback transistor which is in accordance to the current limit.

10. The power providing circuit of claim 1, wherein the power providing circuit comprises a voltage regulator which is configured to regulate the output voltage in accordance to a reference voltage.

11. The power providing circuit of claim 10, wherein
    the voltage regulator comprises voltage sensing means configured to provide an indication of the output voltage, and a differential amplification stage configured to provide an input voltage, based on the reference voltage and based on the indication of the output voltage at the output node; and the control voltage depends on the input voltage.

12. The power providing circuit of claim 1, wherein
the power transistor comprises a p-type metal oxide semiconductor transistor;
the first port comprises a source of the power transistor;
the first port of the power transistor is coupled to the supply voltage;
the second port comprises a drain of the power transistor; and
the second port of the power transistor is coupled to the output of the power providing circuit.

13. A method of providing power and current at an output voltage to a load, comprising the steps of:
drawing by a power transistor the current from a supply voltage, wherein a resistance of the power transistor is controlled using a control voltage which is applied to a control port of the power transistor;
coupling by short circuit protection circuitry the control port of the power transistor with a first port of the power transistor to put the power transistor in an off-state, subject to a drop of the output voltage; wherein the short circuit protection circuitry comprises a short circuit control transistor which comprises a first port and a second port which couple the control port and the first port of the power transistor; wherein a state of the short circuit control transistor is controlled via a control port of the short circuit control transistor; and wherein a voltage level at the control port of the short circuit control transistor depends on the output voltage; wherein the short circuit protection circuitry is configured to couple the control port with the first port of the power transistor within a first reaction time interval, subject to the drop of the output voltage; and
current limit circuitry which is configured to limit the current through the power transistor in accordance to a pre-determined current limit; wherein the current limit circuitry is configured to limit the current through the power transistor in accordance to the pre-determined current limit within a second reaction time interval, subject to the drop of the output voltage; and wherein the first reaction time interval is smaller than the second reaction time interval.

14. The method of claim 13, wherein the short circuit protection circuitry couples the control port of the power transistor with a first port of the power transistor only if
a slope of the drop of the output voltage exceeds a pre-determined slope-threshold; and/or
a level of the drop of the output voltage exceeds a pre-determined level-threshold.

15. The method of claim 13, wherein the short circuit protection circuitry comprises high pass filtering means to derive the voltage level at the control port of the short circuit control transistor by high pass filtering the output voltage.

16. The method of claim 15, wherein the high pass filtering means
provide a voltage level at the control port of the short circuit control transistor such that a threshold voltage of the short circuit control transistor is exceeded, if a short circuit condition is met; wherein the short circuit condition depends on a slope and/or a level of the drop of the output voltage; and otherwise, provide a voltage level at the control port of the short circuit control transistor such that the threshold voltage of the short circuit control transistor is not exceeded.

17. The method of claim 16, wherein the short circuit condition is met, if
the slope of the drop of the output voltage exceeds a pre-determined slope-threshold; and/or
the level of the drop of the output voltage exceeds a pre-determined level-threshold.

18. The method of claim 13, wherein the short circuit protection circuitry comprises
a filtering resistor which is coupled between the control port and the first port of the short circuit control transistor; and
a filtering capacitor which is coupled to the control port of the short circuit control transistor at one side and to the output of the power providing circuit at another side of the filtering capacitor.

19. The method of claim 13, wherein the short circuit protection circuitry comprises a control port amplifier to amplify and/or attenuate a voltage which is derived from the output voltage prior to application to the control port of the short circuit control transistor.

20. The method of claim 13, wherein the current limit circuitry comprises
sensing means to provide an indication of the current through the power transistor;
comparing means to provide a feedback voltage by comparing the indication of the load current with the pre-determined current limit; and
feedback means to set the control voltage at the control port of the power transistor in dependence of the feedback voltage.

21. The method of claim 20, wherein
the sensing means comprise a sensing transistor having a control port that is coupled to the control port of the power transistor, and having a first port that is coupled to the first port of the power transistor, and having a second port that is coupled to a second port of the power transistor via a current mirror; and/or
the feedback means comprise a feedback transistor having a control port that the feedback voltage is applied to, wherein the control voltage is dependent on a resistance of the feedback transistor; and/or
the comparing means comprise a current mirror to map a current through the sensing transistor to the control port of the feedback transistor, and a current source to provide a current to the control port of the feedback transistor which is in accordance to the current limit.

22. The method of claim 13, wherein the power providing circuit comprises a voltage regulator to regulate the output voltage in accordance to a reference voltage.

23. The method of claim 22, wherein
the voltage regulator comprises voltage sensing means to provide an indication of the output voltage, and a differential amplification stage to provide an input voltage, based on the reference voltage and based on the indication of the output voltage at the output node; and
the control voltage depends on the input voltage.

24. The method of claim 13, wherein
the power transistor comprises a p-type metal oxide semiconductor transistor;
the first port comprises a source of the power transistor;
the first port of the power transistor is coupled to the supply voltage;

the second port comprises a drain of the power transistor; and the second port of the power transistor is coupled to the output of the power providing circuit.

* * * * *